United States Patent
Wei et al.

(10) Patent No.: US 12,513,862 B2
(45) Date of Patent: Dec. 30, 2025

(54) CONTAINERIZED DATA SYSTEM

(71) Applicant: Fulian Precision Electronics (Tianjin) Co., LTD., Tianjin (CN)

(72) Inventors: Chao-Ke Wei, New Taipei (TW); Tze-Chern Mao, New Taipei (TW); Yao-Ting Chang, New Taipei (TW); Yen-Chun Fu, New Taipei (TW); Ching-Tang Liu, New Taipei (TW); Chih-Hung Chang, New Taipei (TW); Li-Wen Chang, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 220 days.

(21) Appl. No.: 18/213,957

(22) Filed: Jun. 26, 2023

(65) Prior Publication Data

US 2023/0337401 A1    Oct. 19, 2023

Related U.S. Application Data

(62) Division of application No. 16/990,142, filed on Aug. 11, 2020, now Pat. No. 11,792,960.

(30) Foreign Application Priority Data

May 12, 2020    (CN) .......................... 202010399430.0

(51) Int. Cl.
   *H05K 7/20*    (2006.01)
   *G06F 1/20*    (2006.01)
   *H05K 7/14*    (2006.01)

(52) U.S. Cl.
   CPC .......... *H05K 7/20745* (2013.01); *G06F 1/20* (2013.01); *H05K 7/1497* (2013.01)

(58) Field of Classification Search
   CPC ..... H05K 7/20745; H05K 7/1497; G06F 1/20
   (Continued)

(56) References Cited

U.S. PATENT DOCUMENTS

2009/0050591 A1    2/2009 Hart
2011/0222249 A1*   9/2011 Ruehl ................. H05K 9/0001
                                                       361/752

(Continued)

FOREIGN PATENT DOCUMENTS

CN        102759971 A    10/2012
CN        106604600 A    4/2017
(Continued)

*Primary Examiner* — Steven B McAllister
*Assistant Examiner* — Charles R Brawner
(74) *Attorney, Agent, or Firm* — ScienBiziP, P.C.

(57) ABSTRACT

A containerized data system, including a container body, a first cabinet array, a second cabinet array and a plurality of first air-conditioning devices. The first cabinet array and the second cabinet array are positioned in the container body and spaced apart from each other. Air intake areas of the first cabinet array and the second cabinet array communicates with a cold aisle connection space of the container body. Heat dissipation areas of the first cabinet array and the second cabinet array communicate with a hot aisle connection space of the container body. Air inlets of the first air-conditioning devices are communicated with the hot aisle connection space to collect the hot air flow in the container body, and air outlets of the plurality of first air-conditioning devices are communicated with the cold aisle connection space to convey the cold air flow to the container body.

14 Claims, 11 Drawing Sheets

(58) Field of Classification Search
USPC .......................................................... 454/184
See application file for complete search history.

(56) References Cited

U.S. PATENT DOCUMENTS

| | | | |
|---|---|---|---|
| 2012/0103843 A1* | 5/2012 | Wei | H05K 7/1497 206/320 |
| 2012/0276834 A1 | 11/2012 | Peng et al. | |
| 2014/0240917 A1* | 8/2014 | Nicolai | H05K 7/20836 361/679.48 |
| 2014/0298839 A1 | 10/2014 | Nagamatsu et al. | |
| 2016/0029508 A1* | 1/2016 | Tabe | H05K 7/1497 361/679.48 |
| 2016/0057893 A1 | 2/2016 | Tabe | |
| 2017/0105318 A1 | 4/2017 | Mao et al. | |
| 2017/0280593 A1* | 9/2017 | Magallanes | H05K 7/20818 |
| 2018/0066859 A1 | 3/2018 | Nguyen | |
| 2018/0124955 A1 | 5/2018 | Rogers et al. | |
| 2022/0217861 A1 | 7/2022 | Strech | |

FOREIGN PATENT DOCUMENTS

| | | |
|---|---|---|
| CN | 207733179 U | 8/2018 |
| EP | 2986091 | 2/2016 |

* cited by examiner

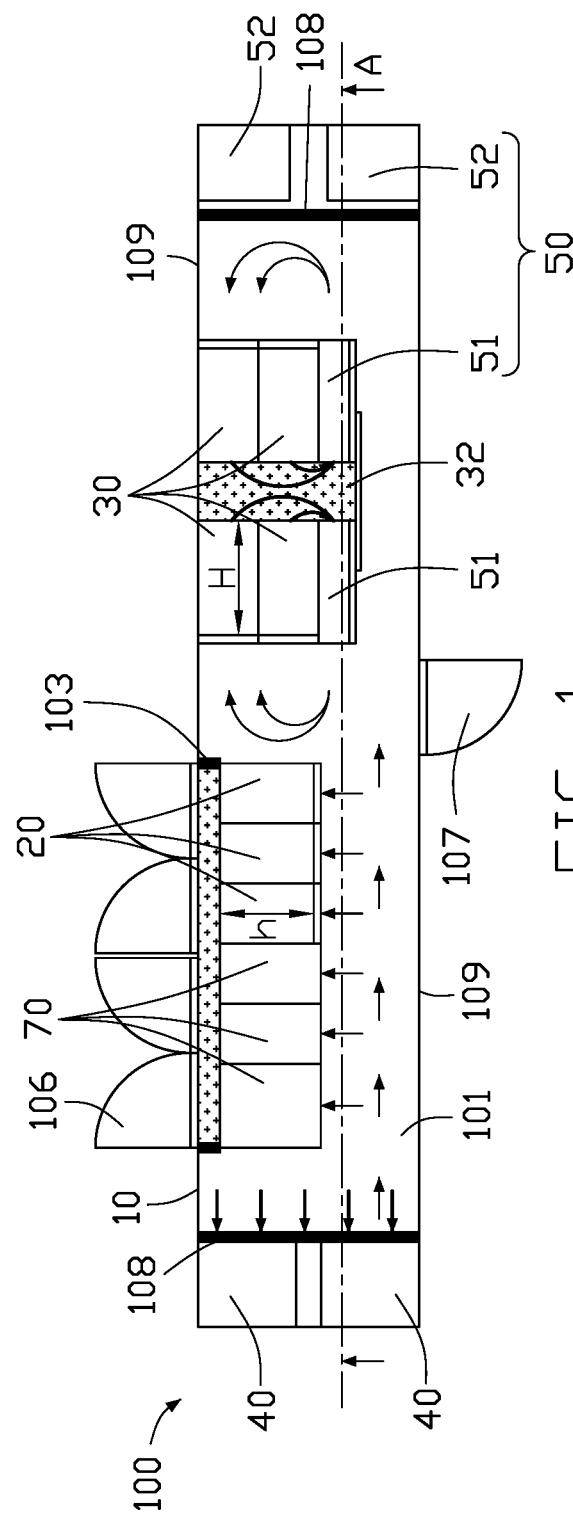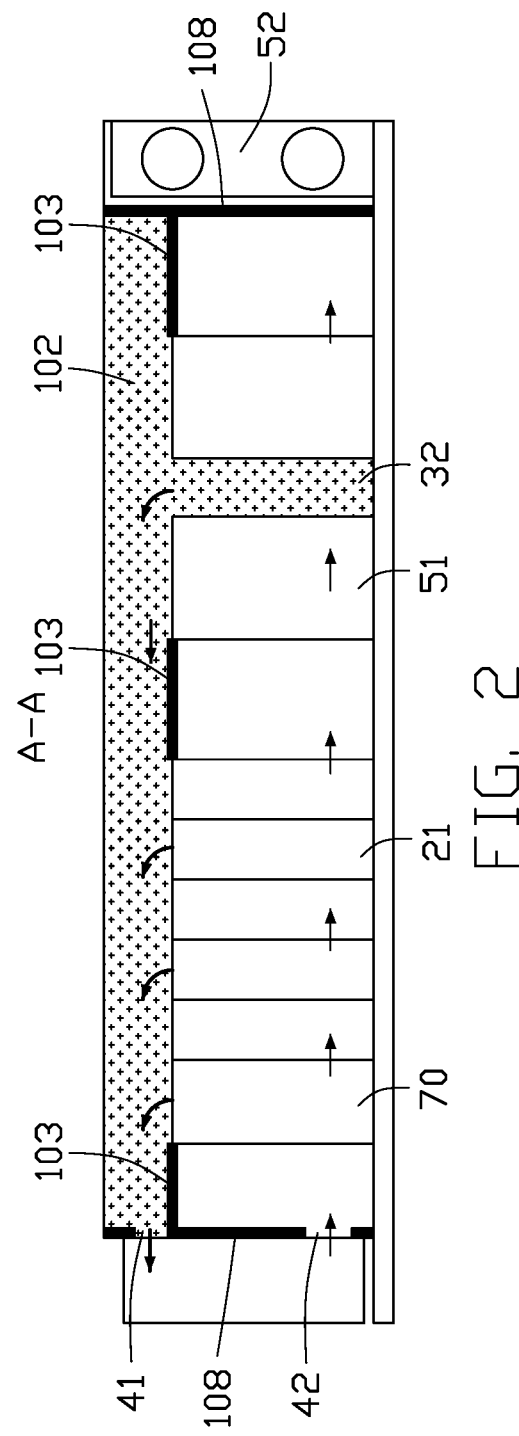

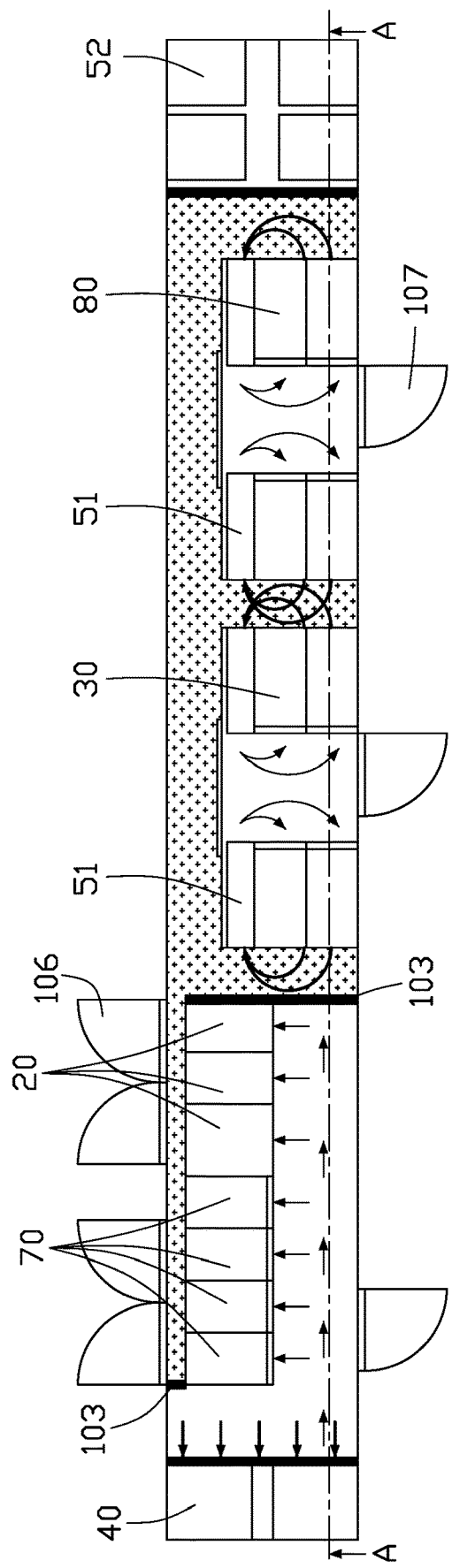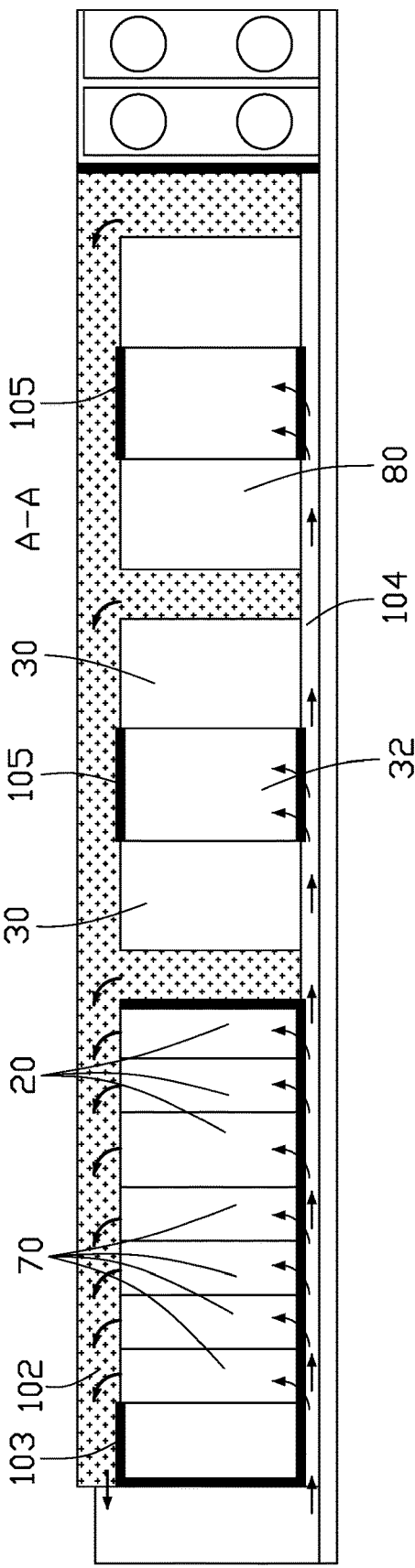

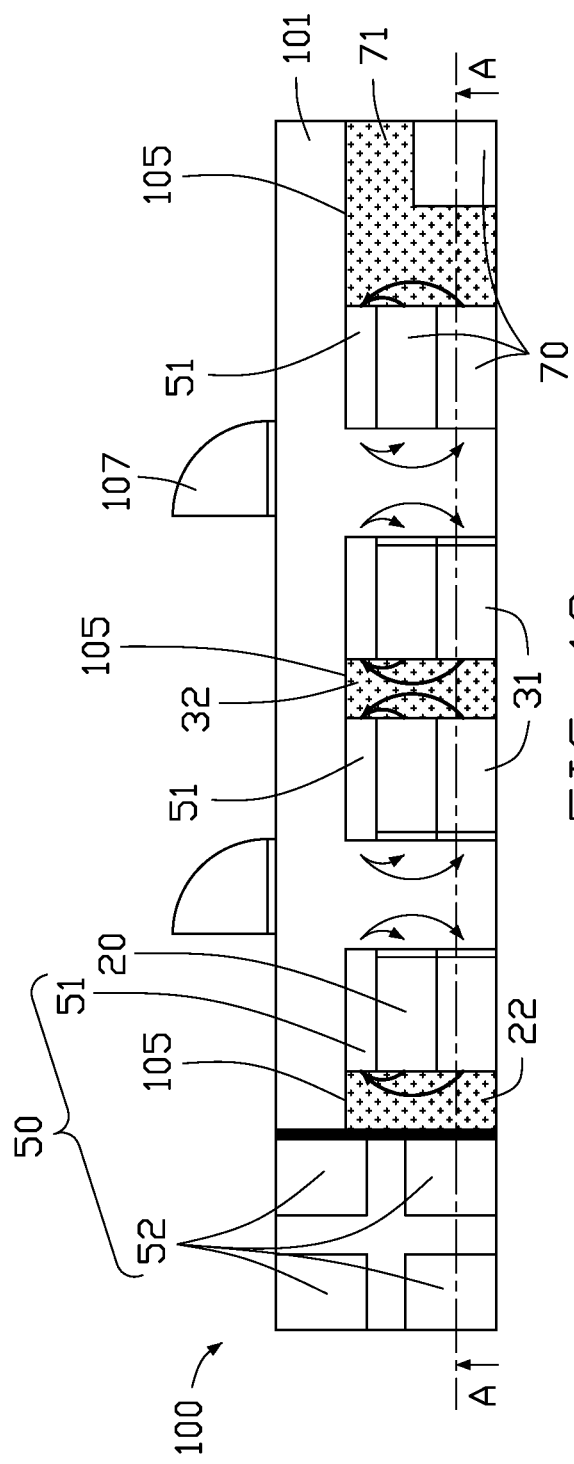
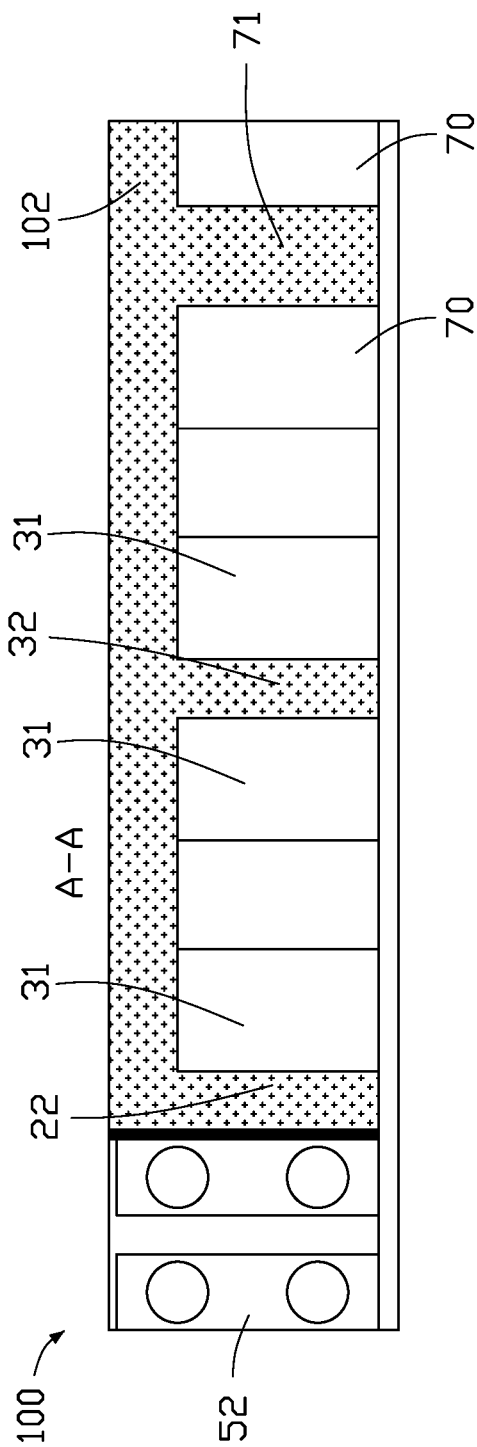
FIG. 13
FIG. 14

CONTAINERIZED DATA SYSTEM

FIELD

The present disclosure relates to a containerized data system.

BACKGROUND

With the rapid development of data computing, the construction speed of traditional computer rooms cannot meet the deployment process of data computing equipment. Containerized data system came into being as a new type of portable data center. Current containerized data systems are usually equipped with multiple high-density computing devices, such as servers, etc., which are prone to generate a large amount of heat energy during the work process, and excessively high temperatures will affect the operating speed of the system. Although the current containerized data system will be equipped with a refrigeration system, the ventilation ducts in each part of the container body are independent of each other. When one of the air-conditioning equipment fails, other air-conditioning equipment cannot assist it, so that the local temperature in the container body is increased, and the heat dissipation performance is decreased.

Thus, there is room for improvement within the art.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

FIG. 1 is a schematic plan view of the containerized data system in a first embodiment.

FIG. 2 is a schematic cross-sectional view of the containerized data system of FIG. 1.

FIG. 11 is a schematic plan view of a containerized data system in an eighth embodiment.

FIG. 12 is a schematic cross-sectional view of the containerized data system of FIG. 11.

FIG. 13 is a schematic plan view of a containerized data system in a ninth embodiment.

FIG. 14 is a schematic cross-sectional view of the containerized data system of FIG. 13.

DETAILED DESCRIPTION

Figure 3:
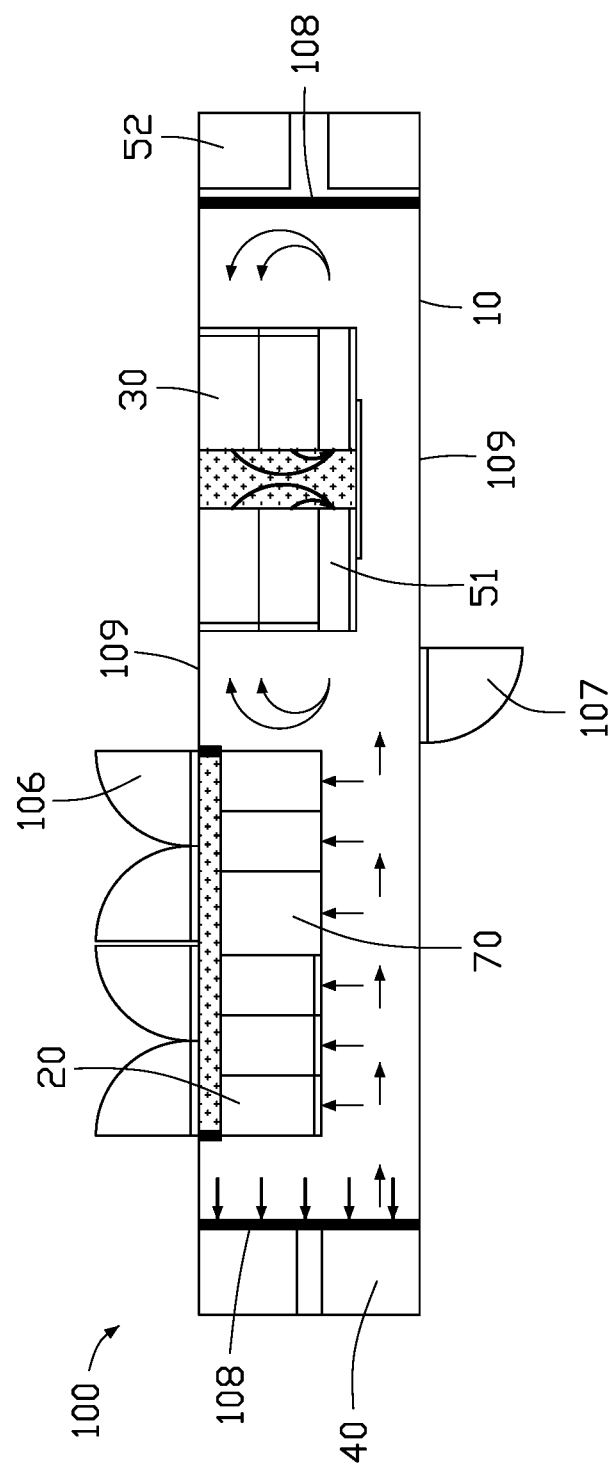
FIG. 3 is a schematic plan view of the containerized data system in a second embodiment.

In order to make the above-mentioned objects, features and advantages of the present application more obvious, a detailed description of specific embodiments of the present application will be described in detail with reference to the accompanying drawings. A number of details are set forth in the following description so as to fully understand the present application. However, the present application can be implemented in many other ways different from those described herein, and those skilled in the art can make similar improvements without violating the contents of the present application. Therefore, the present application is not to be considered as limiting the scope of the embodiments described herein.

Several definitions that apply throughout this disclosure will now be presented.

The term "coupled" is defined as coupled, whether directly or indirectly through intervening components, and is not necessarily limited to physical connections. The connection may be such that the objects are permanently coupled or releasably coupled. The term "substantially" is defined to be essentially conforming to the particular dimension, shape, or other feature that the term modifies, such that the component need not have that exact feature. The term "comprising," when utilized, means "including, but not necessarily limited to"; it specifically indicates open-ended inclusion or membership in the so-described combination, group, series, and the like.

Unless otherwise defined, all technical and scientific terms used herein have the same meaning as commonly understood by one skilled in the art. The terms used in a specification of the present application herein are only for describing specific embodiments and are not intended to limit the present application. The terms "and/or" used herein includes any and all combinations of one or more of associated listed items.

The present application provides a containerized data system, which includes a container body, a first cabinet array and a second cabinet array. The first cabinet array and the second cabinet array are positioned in the container body and spaced apart from each other. The container body is defined with a cold aisle connection space and a hot aisle connection space. The first cabinet array defines a first air intake area and a first heat dissipation area, the first air intake area communicating with the cold aisle connection space, the first heat dissipation area communicating with the hot aisle connection space. The second cabinet array defines a second air intake area and a second heat dissipation area, the second air intake area communicating with the cold aisle connection space, the second heat dissipation area communicating with the hot aisle connection space. The containerized data system further includes a plurality of first air-conditioning devices, which are arranged outside the container body. Each first air-conditioning device defining an air inlet communicating with the hot aisle connection space to collect the hot air flow in the container body, and an air outlet communicating with the cold aisle connection space to convey the cold air flow to the container body.

The containerized data system described above connects a plurality of first air-conditioning devices to the first cabinet array and the second cabinet array through the cold aisle connection space and the hot aisle connection space, so that the mutual takeover performance between air-conditioning equipment is improved, and avoiding the failure of a single air-conditioning equipment to cause a local temperature rise in the container, thereby improving the heat dissipation performance of the containerized data system.

Some embodiments of the present application are described in detail. In the case of no conflict, the following embodiments and the features in the embodiments can be combined with each other.

Please refer to FIG. 1 and FIG. 2, in a first embodiment, the containerized data system 100 includes a container body 10, a first cabinet array 20 and a second cabinet array 30. The first cabinet array 20 and the second cabinet array 30 are positioned in the container body 10 and spaced apart from each other. The container body 10 is provided with a cold aisle connection space 101 and a hot aisle connection space 102. The air intake areas of the first cabinet array 20 and the second cabinet array 30 communicate with the cold aisle connection space 101. The hot aisle connection space 102 connects the heat dissipation areas of the first cabinet array 20 and the second cabinet array 30. The containerized data system 100 further includes a plurality of first air-conditioning devices that are positioned outside the container body 10. The air inlets 41 of the plurality of first air-conditioning devices 40 communicate with the hot aisle connection space 102, to collect the hot air flow in the container body 10. The air outlets 42 of the plurality of first air-conditioning devices 40 communicate with the cold aisle connection space 101, to convey cold air flow into the container body 10. Therefore, the mutual takeover performance between air-conditioning equipment is improved. The heat generated by each cabinet can be taken away, avoiding local temperature raising in the container body 10.

In the first embodiment, the plurality of first air-conditioning devices 40 are positioned outside of two ends of the container body 10. The first air-conditioning device includes, but not limited to, air-cooled stand-alone air conditioner, which has a natural cooling function and is conducive to saving energy. The thinner arrows in the figures are the cold air flow direction, and the thicker arrows in the figures are the hot air flow direction. The marked area in the figure is the hot air flow area, and the blank area is the cold air flow area.

Referring to FIG. 2, the container body 10 has a substantially rectangular parallelepiped structure, including two long side walls 109, two short side walls 108, a bottom plate, and a ceiling. The cold aisle connection space 101 is positioned near the bottom plate of the container body 10, and the hot aisle connection space 102 is close to the ceiling of the container body 10. A walkway for pedestrians is also provided in the cold aisle connection space 101. To facilitate installation, the air inlet 41 of the first air-conditioning device 40 communicates with the ceiling area of the container body 10, and the air outlet 42 of the first air-conditioning device 40 communicates with the lower area of the container body 10.

The first cabinet array 20 includes multiple first server cabinets 21, the second cabinet array 30 includes multiple second server cabinets 31, and a depth h of the first server cabinet 21 is less than a depth H of the second server cabinet 31 is described. The depth h of the first server cabinet 21 is smaller than the width of the short side wall 108 of the container body 10. In order to rationally use the space in the container body 10, the first server cabinet 21 is positioned perpendicular to the long side wall 109 of the container body 10, and the second server cabinet 31 is positioned parallel to the long side wall 109 of the container body 10. In other words, the depth direction of the first server cabinet 21 is perpendicular to the long side wall 109 of the container body 10, and the depth direction of the second server cabinet 31 is parallel to the long side wall 109 of the container body 10. In the first embodiment, the first cabinet array 20 includes at least one row of first server cabinets 21 positioned along the length direction of the long side walls 109. The second cabinet array 30 includes at least two rows of second server cabinets 31, positioned along the direction of the vertical long side walls 109.

A plurality of partition walls 103 are positioned in the container body 10. The plurality of partition walls 103 are positioned between top portions of the first cabinet array and the second cabinet array 30. The partition walls 103 are also positioned between the side wall of the container body 10 and the top portion of the first cabinet array 20, and between the side wall of the container body 10 and top portion of the second cabinet array 30. The partition walls 103 divide the container body 10 into two parts, the space below the partition walls 103 is the cold aisle connection space 101, and the space above the partition walls 103 is the hot aisle connection space 102, so that the cold aisle connection space 101 and the hot aisle connection space 102 are isolated from each other.

Please refer to FIG. 1, in the first embodiment, a side of the first cabinet array close to the long side wall 109 of the container body 10 is the first heat dissipation area, and another side of the first cabinet array 20 facing away from the first heat dissipation area is the first air intake area. Partition walls 103 are also positioned on both sides of the first heat dissipation area of the first server cabinet 21, to separate the first heat dissipation area from the cold aisle connection space 101. The upper portion of the first heat dissipation area of the first cabinet array 20 communicates with the hot aisle connection space 102, and the first air intake area is located at a side of the cold aisle connection space 101. In the second cabinet array 30, each row of second server cabinets 31 is positioned against the long side wall 109 of the container body 10. An airflow channel 32 is provided between adjacent two rows of second server cabinets 31. In the first embodiment, the airflow channel 32 is a second heat dissipation area of the second cabinet array 30, the upper portion of the airflow channel 32 communicates with the hot aisle connection space 102, and the side of the airflow channel 32 is separated from the cold aisle connection space 101. The outside of the second cabinet array 30 is the second air intake area, and the second air intake area communicates with the cold aisle connection space 101.

The containerized data system 100 further includes a second air-conditioning device 50, which is positioned in the container body 10 and is located at a side of the second cabinet array 30 to enhance the local heat dissipation of the second cabinet array 30. Each row of second server cabinets 31 corresponds to a second air-conditioning device 50. The second air-conditioning device 50 includes, but not limited to, an air-cooled inter-row air conditioner, which has a good cooling performance.

The second air-conditioning device 50 includes a second air-conditioning internal unit 51 and a second air-conditioning external unit 52. Since the depth dimension of the second server cabinet 31 is large, and the heat dissipation performance of the second server cabinet 31 is poor compared to the first server cabinet 21, the second air-conditioning internal unit 51 is positioned in the container body 10 and located at a side of the second cabinet array 30, to enhance the local heat dissipation of the second cabinet array 30, and ensure the heat dissipation capacity of the containerized data system 100. Each row of second server cabinets 31 corresponds to one second air-conditioning internal unit 51. The second air-conditioning external unit 52 is positioned outside the container body 10 and communicates with the second air-conditioning internal unit 51 to assist cooling. The number of the second air-conditioning internal units 51 matches the number of the second air-conditioning external units 52. One second air-conditioning internal unit 51 may be connected to one second air-conditioning external unit 52, or multiple second air-conditioning internal units 51 may be connected to one second air-conditioning external unit 52, which is not limited to the present application. The second air-conditioning device 50 is preferably an air-cooled inter-row air conditioner, which has large cooling power and good cooling performance.

The containerized data system 100 further includes a power cabinet 70 for providing electrical energy to the first cabinet array 20 and the second cabinet array 30. The power cabinet 70 is positioned a side of the first cabinet array 20 away from the second cabinet array 30. A maintenance access door 106 is defined on a long side wall 109 of the container body 10, the maintenance access door 106 corresponds to the power cabinet 70 and the first cabinet array 20. An operation access door 107 is defined on another long side wall 109 of the container body 10. A worker can enter the containerized data system 100 through the operation access door 107.

Referring to FIG. 3, a containerized data system 100 of a second embodiment is substantially the same as the first embodiment, except that the power cabinet 70 is positioned between the first cabinet array 20 and the second cabinet array 30 in the second embodiment. Therefore, the length of circuits from the power cabinet 70 to the first cabinet array 20 or the second cabinet array 30 can be the shortest.

Figure 4:
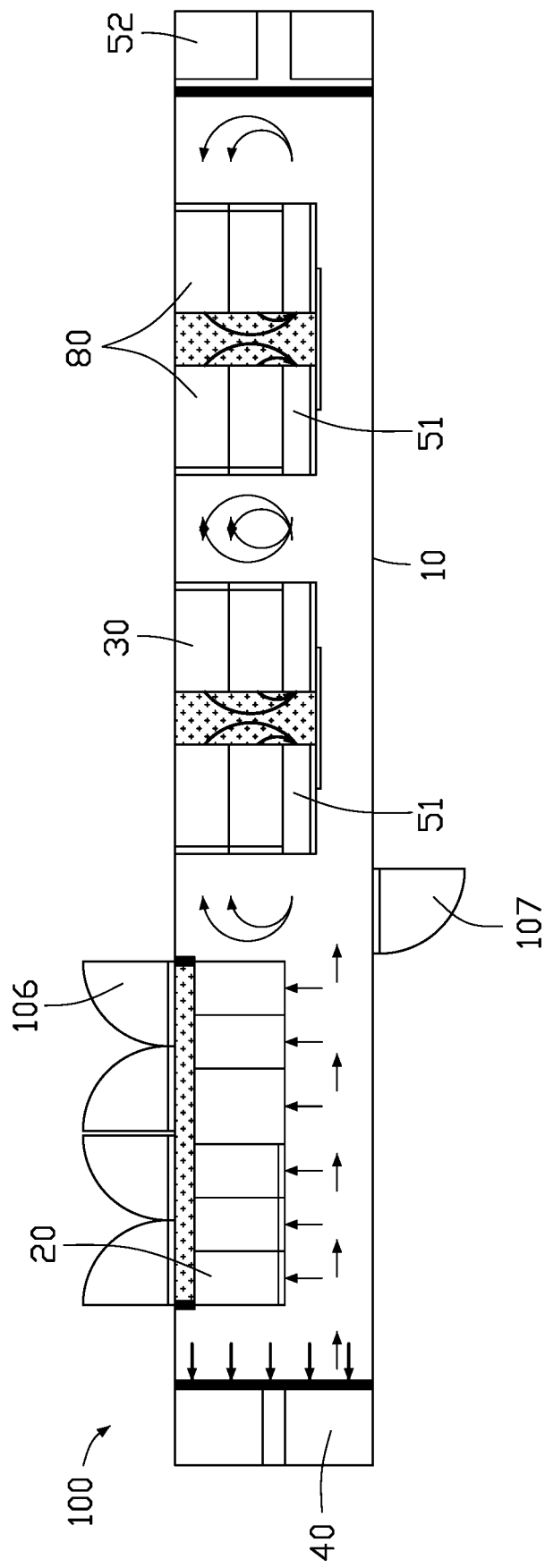
FIG. 4 is a schematic plan view of a containerized data system in a third embodiment.

Referring to FIG. 4, a containerized data system 100 of a third embodiment is substantially the same as the first embodiment. The difference is that the containerized data system 100 of the third embodiment further includes a third cabinet array 80. The third cabinet array 80 is arranged in parallel with the second cabinet array 30 or the first cabinet array 20. The third cabinet array defines a third air intake area communicating with the cold aisle connection space 101, and a third heat dissipation area of the third cabinet array 80 communicating with the hot aisle connection space 102. The third cabinet array 80 may be formed by the second cabinet array 30 or the first cabinet array 20 extending along the length direction of the container body 10, to rationally use the interior of the container body 10 with a longer length space.

Figure 5:
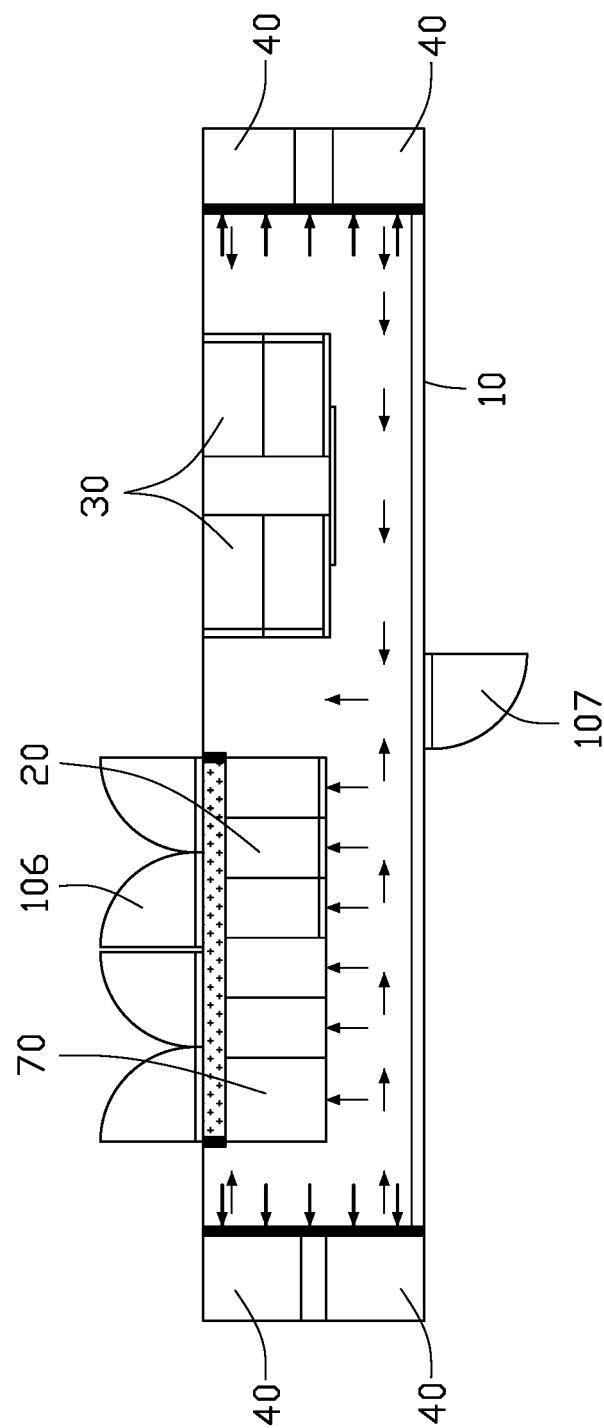
FIG. 5 is a schematic plan view of the containerized data system in a fourth embodiment.

Referring to FIG. 5, a containerized data system 100 of a fourth embodiment is substantially the same as the first embodiment. The difference is that the second air-conditioning device 50 is not installed in the container body 10. The second air-conditioning device 50 is replaced with the first air-conditioning device 40 in the fourth embodiment, and the second cabinet array 30 is cooled by the first air-conditioning device 40. In the fourth embodiment, the heat dissipation requirements in the container body 10 can be met by increasing the power of the first air-conditioning device 40. When the power of the first cabinet array 20 and the second cabinet array 30 is relatively small, the power of the first air-conditioning device 40 may not be changed. It suffices to ensure that the heat dissipation power of the first air-conditioning device 40 matches the working power of the first cabinet array 20 and the second cabinet array 30.

Figure 6:
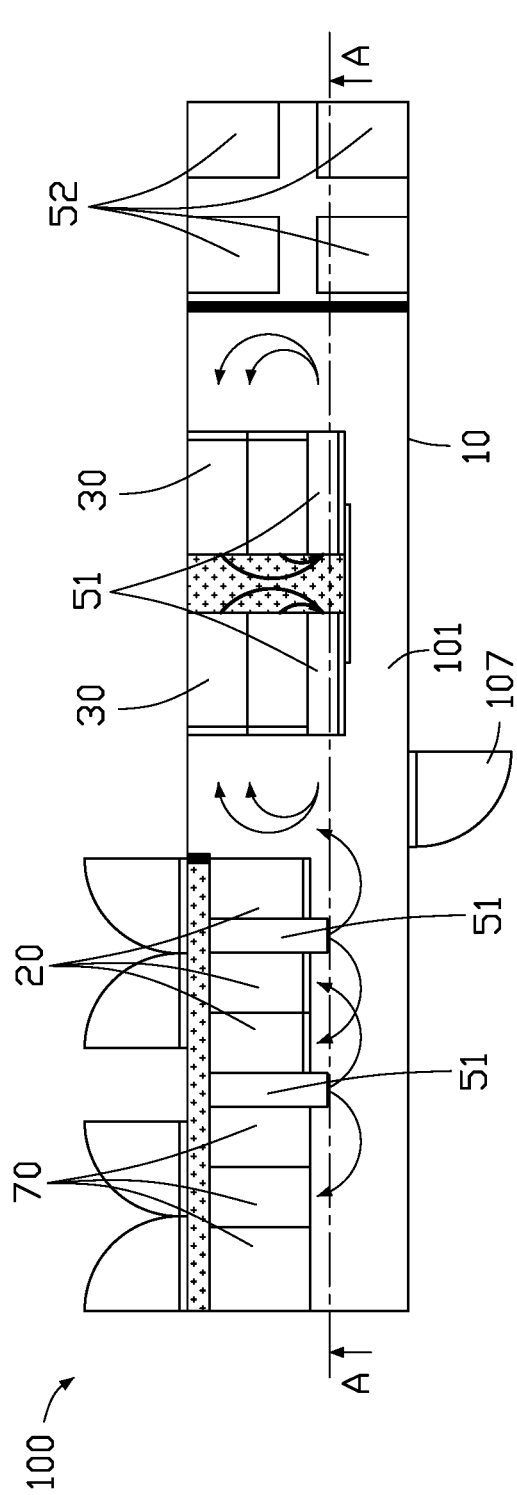
FIG. 6 is a schematic plan view of a containerized data system in a fifth embodiment.
Figure 7:
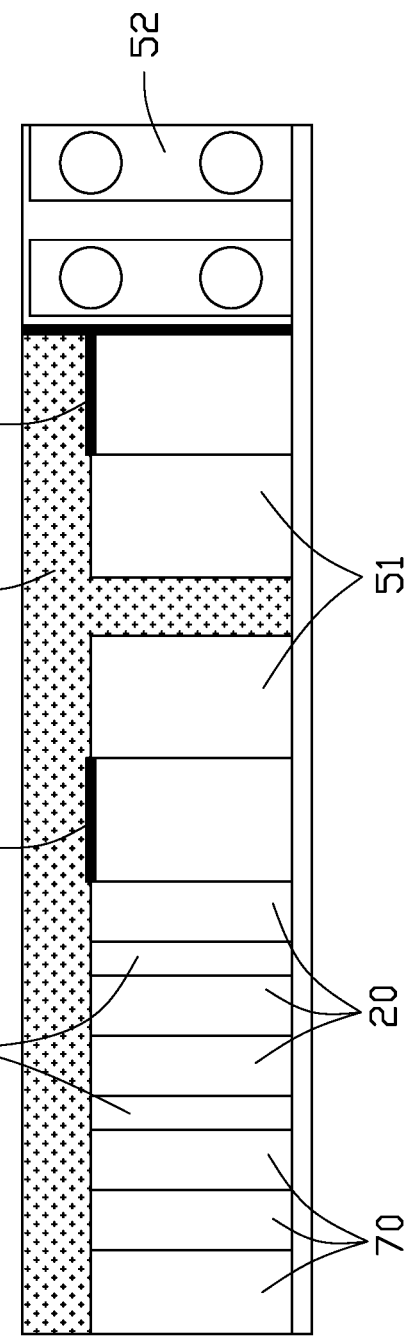
FIG. 7 is a schematic cross-sectional view of the containerized data system of FIG. 6.

Referring to FIG. 6 and FIG. 7, a containerized data system 100 of the fifth embodiment is substantially the same as the first embodiment, except that the first air-conditioning device 40 may be replaced with a second air-conditioning device 50, that is, the first cabinet array 20 is also cooled by the second air-conditioning device 50. The second air-conditioning device 50 is positioned in the first cabinet array 20 and is used to enhance local heat dissipation of the first cabinet array 20. One second air-conditioning internal unit 51 is positioned between the two first server cabinets 21, and another second air-conditioning internal unit 51 is interposed between the first cabinet array 20 and the power cabinet 70. Therefore, local heat dissipation effects of the first cabinet array 20 and the power cabinet 70 are improved, the unstable power supply of the power cabinet 70 is avoided, and also the risk of fire is reduced. In the fifth embodiment, a plurality of second air-conditioning external units 52 are collectively positioned at an outside end of the container body 10, which is good for installing and maintaining the multiple second air-conditioning external units 52. In another embodiment, the first air-conditioning device 40 and the second air-conditioning device 50 also can be provided in the containerized data system 100 at the same time.

Figure 8:
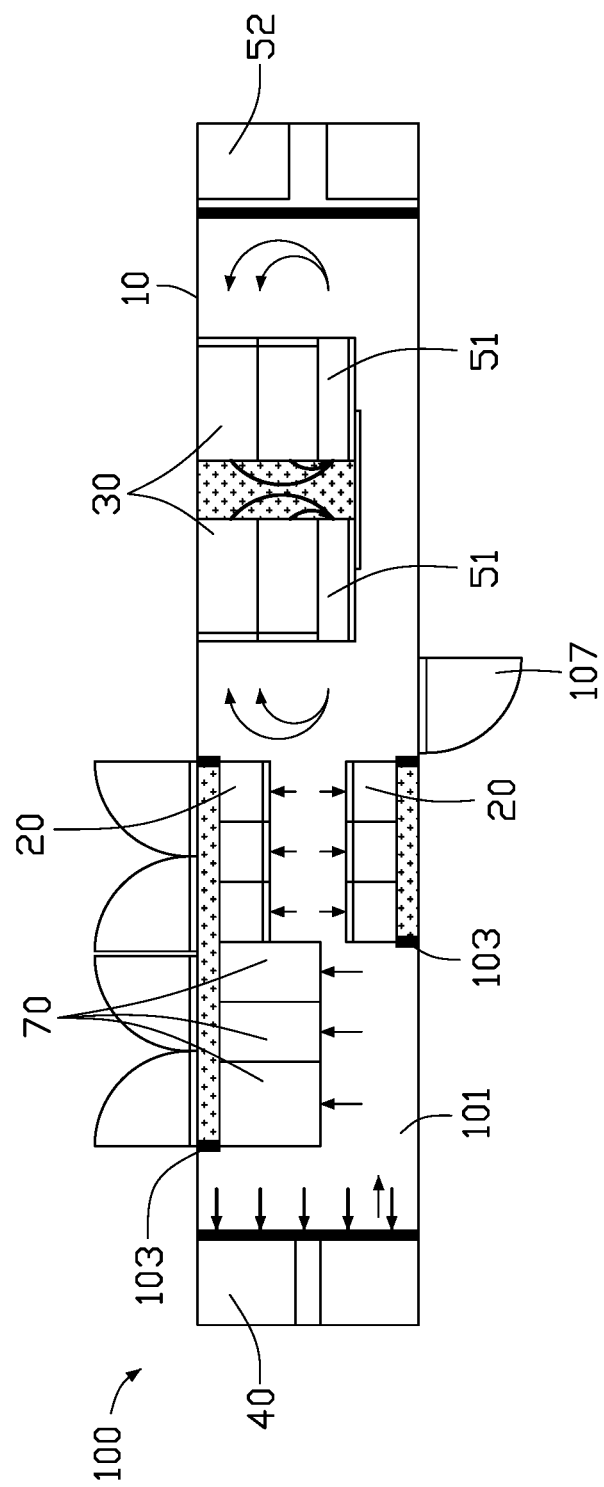
FIG. 8 is a schematic plan view of a containerized data system in a sixth embodiment.

Referring to FIG. 8, a containerized data system 100 of a sixth embodiment is substantially the same as the first embodiment. The difference is that the depth h of the first server cabinet 21 is less than half the dimension of the short side wall 108 of the container body 10 in the sixth embodiment. In order to facilitate the removal of the first server cabinet 21 from the container body 10 or to facilitate the user to operate on the first server cabinet 21, the depth h of the first server cabinet 21 is preferably a quarter of the dimension of the short side wall 108 of the container body 10. The first cabinet array 20 includes two rows of first server cabinets 21, and the two rows of first server cabinets 21 are oppositely arranged and are respectively close to two long side walls 109. The area between the two rows of first server cabinets 21 is the first air intake area of the first cabinet array 20, which may also be referred to as an operation area. The first air intake area is a part of the cold aisle connection space 101. The areas between the two rows of first server cabinets 21 and the two long side walls 109 are the first heat dissipation areas of the first cabinet array 20. There are partition walls 103 on both sides of the two first heat dissipation areas, to isolate the first heat dissipation area from the cold aisle connection space 101. The upper portion of the two first heat dissipation areas communicates with the hot aisle connection space 102.

Figure 9:
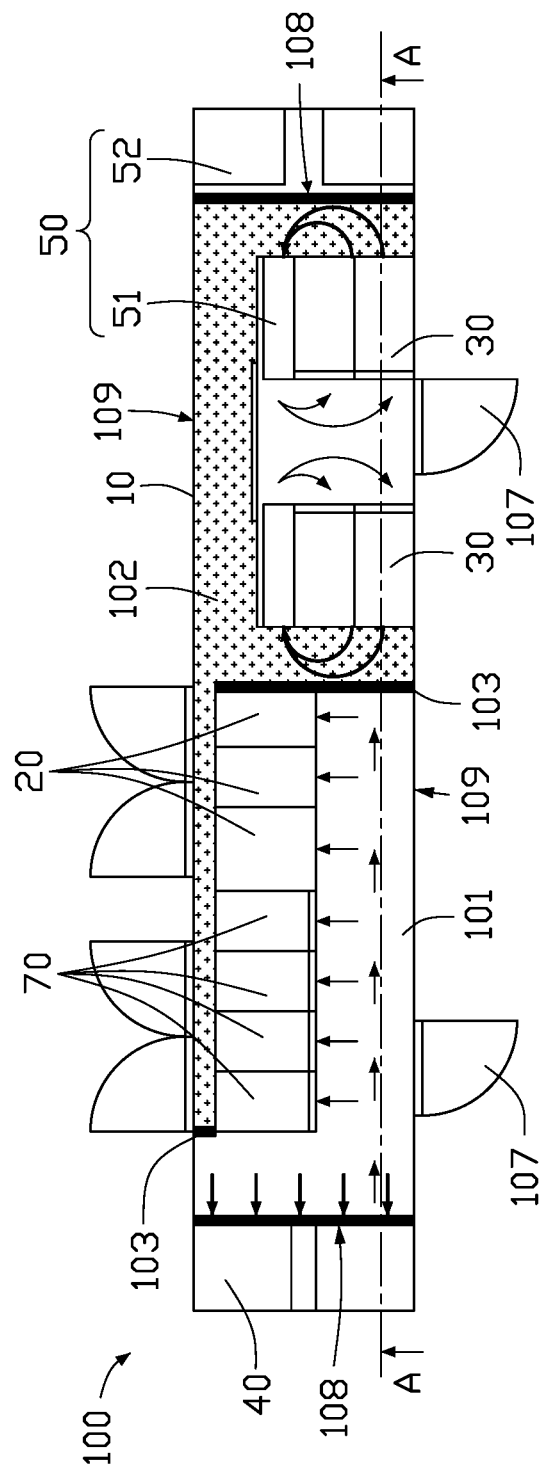
FIG. 9 is a schematic plan view of a containerized data system in a seventh embodiment.
Figure 10:
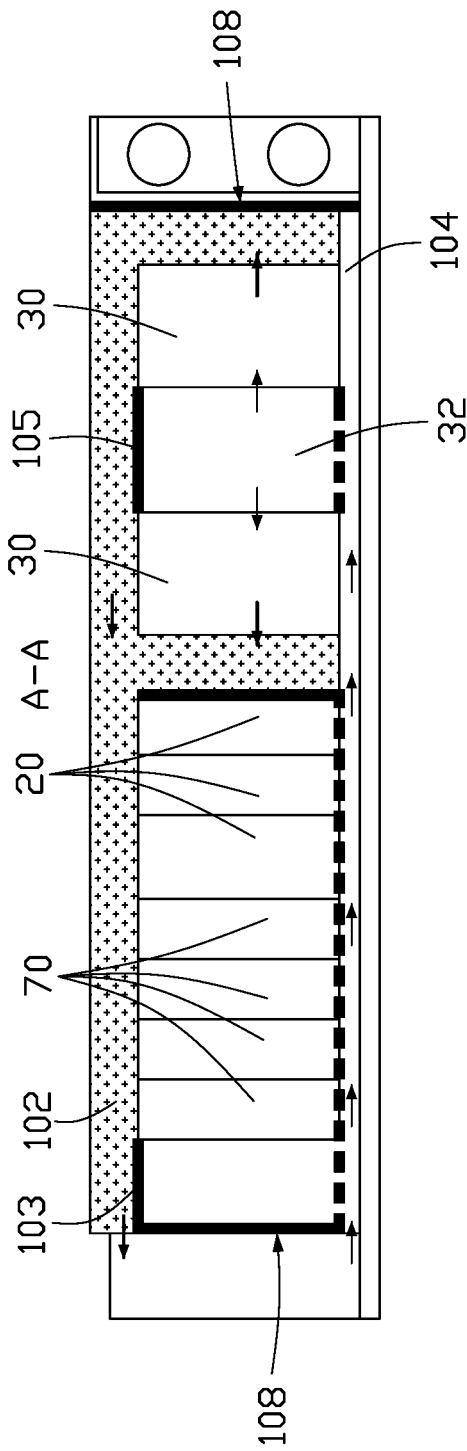
FIG. 10 is a schematic cross-sectional view of the containerized data system of FIG. 9.

Referring to FIG. 9 and FIG. 10, a containerized data system 100 of a seventh embodiment is substantially the same as the first embodiment, except that an overhead area 104 is provided at the lower portion of the container body 10 in the seventh embodiment, and the cold aisle connection space 101 communicates with the overhead area 104. The airflow channel 32 between the adjacent two rows of the second server cabinets 31 communicates with the overhead area 104.

A blocking member 105 is provided in the container body 10, and the blocking member 105 covers the area between two adjacent rows of the second server cabinets 31, to isolate the airflow channel 32 from the hot aisle connection space 102. A partition wall 103 is also positioned at a side of the first cabinet array 20 and is vertically connected with the long side wall 109. With a partition wall 103 positioned at a side of the power cabinet 70, a closed space covering the power cabinet 70 and the first cabinet array 20 is formed, and the closed space is the cold aisle connection space 101. The top surfaces and side surfaces near the long side wall 109 of the power cabinet 70 and the first cabinet array 20 are heat dissipation surfaces. The heat dissipation surfaces of the power cabinet 70 and the first cabinet array 20 is in contact with the hot aisle connection space 102, so that the heat generated by the power cabinet 70 and the first cabinet array 20 can be taken away along with the hot air flow. The other surfaces of the power cabinet 70 and the first cabinet array are located in the closed space, and the bottom of the closed space communicates with the overhead area 104. The bottom portion of the airflow channel 32 communicates with the overhead area 104, so that cold airflow can enter the airflow channel 32 through the overhead area 104, to dissipate heat from the second cabinet array 30. In the seventh embodiment, all the outer areas of the second cabinet array 30 are the second heat dissipation areas and communicate with the hot aisle connection space 102. An operation access door 107 is defined on the long side wall 109 of the container body 10. The operation access door 107 is corresponded to the airflow channel 32, to facilitate the user to enter the second cabinet array 30.

Referring to FIG. 11 and FIG. 12, a containerized data system 100 of an eighth embodiment is substantially the same as the first embodiment, except that a third cabinet array 80 is provided in the container body 10 of the eighth embodiment. The third cabinet array 80 may be formed by the second cabinet array 30 or the first cabinet array 20 extending along the length direction of the container body 10. In other embodiments, more container arrays may be extended in the container body 10, as long as the internal size of the container body 10 is large enough, which is not limited in this application.

Referring to FIG. 13 and FIG. 14, a containerized data system 100 of a ninth embodiment is substantially the same as the first embodiment, except that the first cabinet array 20 and the second cabinet array 30 are all composed of the second server cabinets 31 in the ninth embodiment. The second server cabinet 31 is entirely cooled by the second air-conditioning device 50. The second air-conditioning device 50 includes, but not limited to, an air-cooled row room air conditioner. The first cabinet array 20 and the power cabinet 70 are respectively positioned at both sides of the second cabinet array 30. The cold aisle connection space 101 is located on one side in the container body 10, and the spaces between the first cabinet array 20, the second cabinet array 30, and the power cabinet 70 are communicated with the cold aisle connection space 101, to become a part of the cold aisle connection space 101, and to facilitate cold air flow into the first cabinet array 20, the second cabinet array 30, and the power cabinet 70. A second airflow channel 22 is provided between the first cabinet array 20 and a left side wall of the container body 10, and a third airflow channel 71 is provided between the power cabinet 70 and a right side wall of the container body 10. Sides of the second airflow channel 22, the third airflow channel 71, and the airflow channel 32 in the second cabinet array 30 are separated from the cold aisle connection space 101 by a blocking member 105. Top portions of the second airflow channel 22, the third airflow channel 71 and the airflow channel 32 communicate with the hot aisle connection space 102, so as to realize the communication of the air channel between the various devices, which is beneficial to the mutual takeover between the air-conditioning devices.

Figure 15:
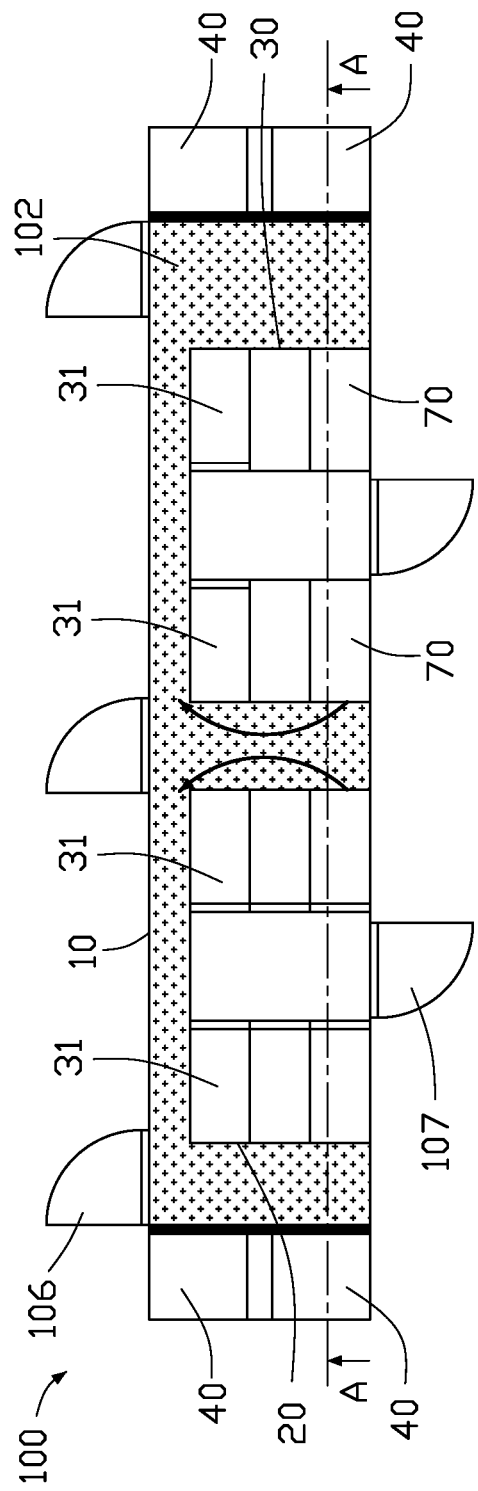
FIG. 15 is a schematic plan view of a containerized data system in a tenth embodiment.
Figure 16:
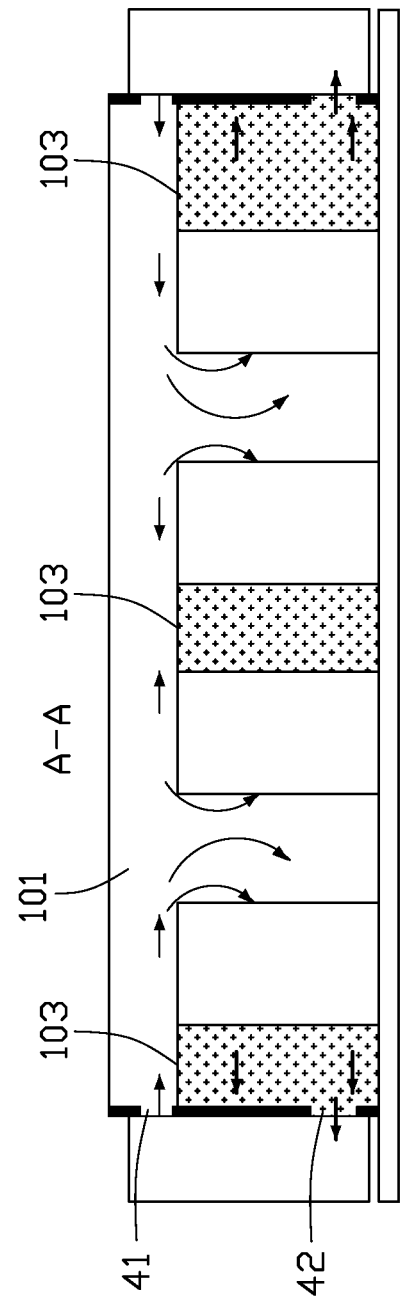
FIG. 16 is a schematic cross-sectional view of the containerized data system of FIG. 15.

Referring to FIG. 15 and FIG. 16, a containerized data system 100 of a tenth embodiment is substantially the same as the ninth embodiment. The difference is that the second air-conditioning device 50 is replaced by the first air-conditioning device 40 in the tenth embodiment. The air-conditioning device 40 includes, but not limited to, an air-cooled stand-alone air conditioner. The air outlet 42 of the first air-conditioning device communicates with the ceiling area, and the air inlet 41 of the first air-conditioning device 40 communicates with the lower area in the container body 10. In other words, the cold and hot aisle connection space of the tenth embodiment is opposite to that of the ninth embodiment. In the tenth embodiment, the power cabinet 70 may be positioned in parallel with the second server cabinet 31 to form a second cabinet array 30.

Figure 17:
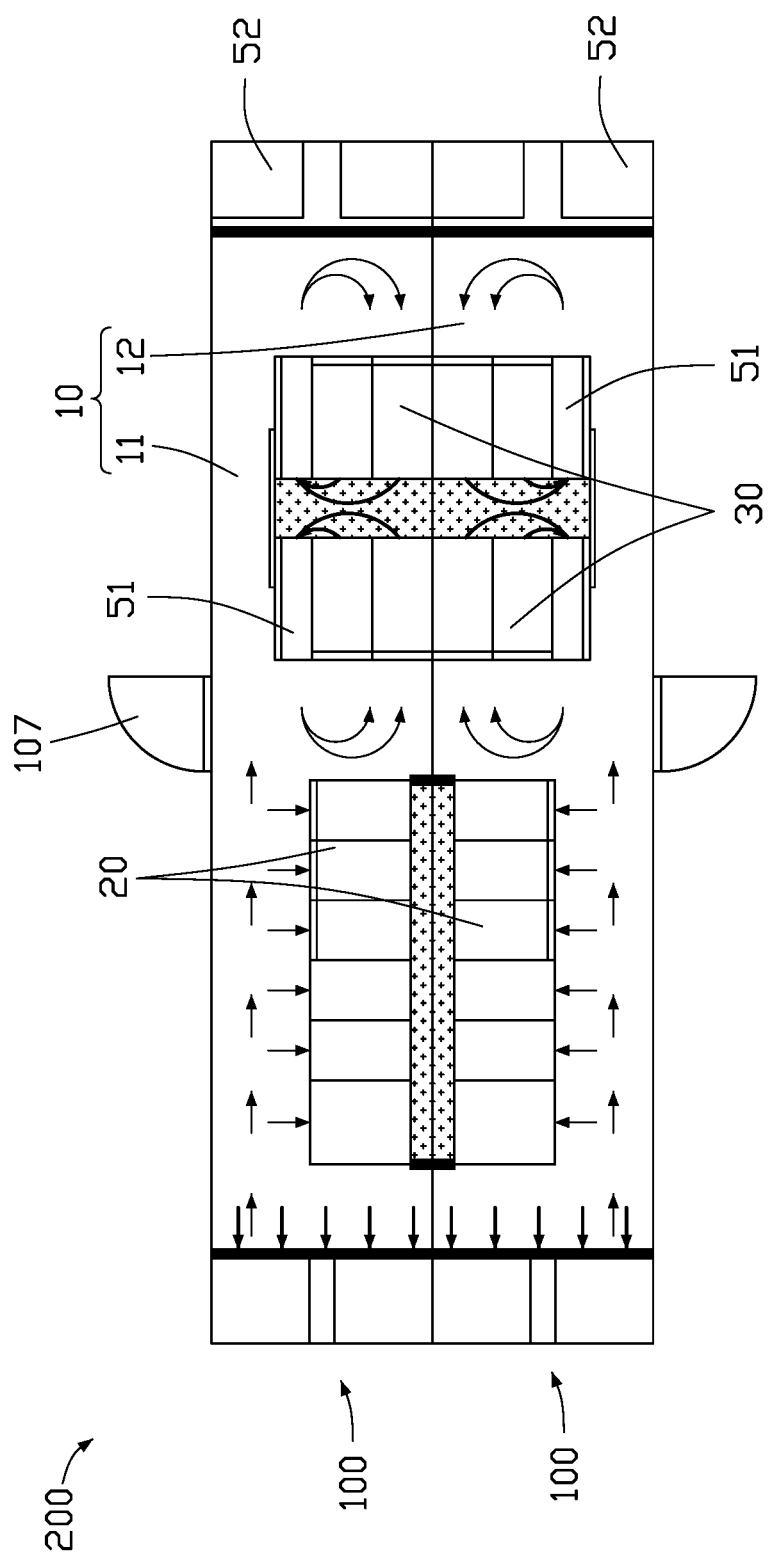
FIG. 17 is a schematic plan view of the containerized data system in an eleventh embodiment.

Referring to FIG. 17, in an eleventh embodiment, a container body 10 of a containerized data system 200 includes a first container body 11 and a second container body 12. The first container body 11 and the second container body 12 are positioned side by side and interconnected. The containerized data system 200 may be composed of any of the two containerized data systems 100 described above. Therefore, the first container body 11 and the second container body 12 are provided with the first cabinet array 20 and the second cabinet array 30. The other structure of the containerized data system 200 is the same as that of the first embodiment, and will not be repeated here. In other embodiments, the containerized data system 200 may also be composed of multiple containerized data systems 100 of the first embodiment, which is not limited in this application.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A containerized data system, comprising:
a container body defining a cold aisle connection space and a hot aisle connection space;
a first cabinet array, positioned in the container body, and defining a first air intake area and a first heat dissipation area, the first air intake area communicating with the cold aisle connection space, the first heat dissipation area communicating with the hot aisle connection space;
a second cabinet array, positioned in the container body and spaced apart from the first cabinet array, the second cabinet array defining a second air intake area and a second heat dissipation area, the second air intake area communicating with the cold aisle connection space, the second dissipation area communicating with the hot aisle connection space; and
a plurality of first air-conditioning devices, which are arranged outside the container body, each of the first air-conditioning devices defining an air inlet communicating with the hot aisle connection space to collect the hot air flow in the container body and an air outlet communicating with the cold aisle connection space to convey the cold air flow to the container body; wherein the container body comprises two long side walls, two short side walls, a bottom plate, and a ceiling; the cold aisle connection space is positioned near the bottom plate of the container body, and the hot aisle connection space is close to the ceiling of the container body; and an operation access door is defined on one of the two long side walls of the container body, the operation access door is corresponded to the cold aisle connection space;

a plurality of partition walls are positioned in the container body, the plurality of partition walls is positioned between top portions of the first cabinet array and the second cabinet array, and between one of the two short side walls of the container body and a top portion of the first cabinet array, and between one of the two short side walls of the container body and a top portion of the second cabinet array, a space below the plurality of partition walls is the cold aisle connection space, and a space above the plurality of partition walls is the hot aisle connection space.

2. The containerized data system as claimed in claim 1, wherein the first cabinet array comprises a plurality of first server cabinets, the second cabinet array comprises a plurality of second server cabinets, a depth h of each of the plurality of first server cabinets is less than a depth H of the plurality of second server cabinets.

3. The containerized data system as claimed in claim 2, wherein the containerized data system further comprises a second air-conditioning device, a portion of the second air-conditioning device is positioned in the container body and is located at a side of the second cabinet array.

4. The containerized data system as claimed in claim 3, wherein the second air-conditioning device comprises a second air-conditioning internal unit and a second air-conditioning external unit, the second air-conditioning internal unit is positioned in the container body and located at a side of the second cabinet array, the second air-conditioning external unit is positioned outside the container body and communicates with the second air-conditioning internal unit to assist cooling.

5. The containerized data system as claimed in claim 3, wherein the second cabinet array comprises at least two rows of the second server cabinets, each row of the second server cabinets corresponds to one second air-conditioning device.

6. The containerized data system as claimed in claim 1, wherein the containerized data system further comprises a power cabinet for providing electrical energy to the first cabinet array and the second cabinet array.

7. The containerized data system as claimed in claim 6, wherein the power cabinet is positioned at a side of the first cabinet array away from the second cabinet array.

8. The containerized data system as claimed in claim 1, wherein the container body comprises a first container body and a second container body, the first container body and the second container body are positioned side by side and interconnected, the first container body and the second container body are both provided with the first cabinet array and the second cabinet array.

9. The containerized data system as claimed in claim 2, wherein each of the plurality of first server cabinets is positioned perpendicular to one of the two long side walls of the container body, and the second server cabinet is positioned parallel to one of the two long side walls of the container body.

10. The containerized data system as claimed in claim 1, wherein a side of the first cabinet array close to one of the two long side walls of the container body is the first heat dissipation area, and another side of the first cabinet array facing away from the first heat dissipation area is the first air intake area, the partition walls are positioned at both sides of the first heat dissipation area of each of the plurality of first server cabinets, to separate the first heat dissipation area from the cold aisle connection space.

11. The containerized data system as claimed in claim 10, an upper portion of the first heat dissipation area communicates with the hot aisle connection space, and the air intake area of the first cabinet array is located at a side of the cold aisle connection space.

12. The containerized data system as claimed in claim 1, wherein an airflow channel is provided between adjacent two rows of the second server cabinets, the airflow channel is the second heat dissipation area of the second cabinet array, an upper portion of the airflow channel communicates with the hot aisle connection space, and a side of the airflow channel is separated from the cold aisle connection space.

13. The containerized data system as claimed in claim 1, wherein a maintenance access door is defined on one of the two long side walls of the container body, the maintenance access door corresponds to the first cabinet array, the operation access door is defined on another one of the two long side walls of the container body.

14. The containerized data system as claimed in claim 1, wherein the first cabinet array comprises two rows of the first server cabinets, and the two rows of the first server cabinets are oppositely arranged and are respectively close to the two long side walls of the container body.

* * * * *